United States Patent [19]

Trillwood

[11] 4,266,111
[45] May 5, 1981

[54] APPARATUS FOR TRANSFERRING WORK THROUGH A REGION OF REDUCED PRESSURE FOR THE PERFORMANCE OF AN OPERATION THEREON

[75] Inventor: Richard E. Trillwood, Histon, England

[73] Assignee: Wentgate Engineers (1976) Limited, Cambridgeshire, England

[21] Appl. No.: 2,753

[22] Filed: Jan. 11, 1979

[51] Int. Cl.³ .................. B23K 15/00; B65G 65/30
[52] U.S. Cl. .................. 219/121 EN; 219/121 EM; 219/121 EC; 219/121 EX; 414/217; 198/472; 198/795
[58] Field of Search .............. 219/121 EB, 121 EC, 219/121 ED, 121 EL, 121 EN, 121 EX, 121 EM; 269/56, 67, 68; 414/217; 198/472, 795

[56] References Cited

U.S. PATENT DOCUMENTS

| | | | |
|---|---|---|---|
| 1,396,859 | 11/1921 | Long | 414/217 |
| 2,618,982 | 11/1952 | Mead | 269/68 X |
| 2,968,723 | 1/1961 | Steigerwald | 219/121 EM X |
| 3,375,342 | 3/1968 | Robinson | 219/121 EM X |
| 3,380,322 | 4/1968 | Brault | 269/67 X |
| 3,401,249 | 9/1968 | Schleich et al. | 219/121 EB |
| 3,612,815 | 10/1971 | Hinrichs | 219/121 EB |
| 3,690,433 | 9/1972 | Buldini | 198/345 |
| 3,756,435 | 9/1973 | Steigerwald | 414/217 |
| 3,811,548 | 5/1974 | Neff | 198/472 X |
| 4,013,261 | 3/1977 | Steigerwald et al. | 219/121 EB X |

FOREIGN PATENT DOCUMENTS

| | | | |
|---|---|---|---|
| 2332581 | 4/1975 | Fed. Rep. of Germany | 219/121 EB |
| 2742938 | 3/1978 | Fed. Rep. of Germany | 219/121 EM |
| 1122296 | 8/1968 | United Kingdom | 219/121 EB |

OTHER PUBLICATIONS

Barber, "Two Chamber Air to Vacuum Lock System", *IBM Tech. Disc. Bull.*, vol. 11, No. 7, Dec. 1968, pp. 757–758.

*Primary Examiner*—Thomas J. Kozma
*Assistant Examiner*—E. F. Borchelt
*Attorney, Agent, or Firm*—Roylance, Abrams, Berdo & Farley

[57] ABSTRACT

The invention provides apparatus suitable for use in continuous transfer of workpieces through a region of reduced pressure in which some operation is to be performed on each workpiece in turn, being particularly, but not exclusively, suitable for electron beam welding. The apparatus comprises a sealed chamber, to constitute the region of reduced pressure, and a passageway extending therethrough, with means defining a series of compartments for containing individual workpieces, the compartments being movable in succession along the passageway and through an operating station in the sealed chamber where the interior of each compartment in turn is exposed to the interior of the sealed chamber for the performance of an operation on a workpiece carried in the compartment. Each compartment is arranged to be sealed from adjacent compartments when it is upstream or downstream of the operating station so that the pressure in each compartment in turn can be reduced to a level intermediate atmospheric pressure and the reduced pressure in the sealed chamber before that compartment reaches the operation station, thereby avoiding excessive fluctuations in the pressure in the sealed chamber which might otherwise occur. Conveniently, but not essentially, the pressure in each compartment in turn is partially raised downstream of the operating station before it arrives at an output end of the passageway.

33 Claims, 2 Drawing Figures

APPARATUS FOR TRANSFERRING WORK THROUGH A REGION OF REDUCED PRESSURE FOR THE PERFORMANCE OF AN OPERATION THEREON

FIELD OF THE INVENTION

This invention relates to apparatus for transferring workpieces through a region of reduced pressure constituted by a sealed chamber in which some operation is to be performed on each workpiece. The construction of the chamber itself is not critical, since for example, an existing vacuum chamber may be used without requiring any radical modification to its pumping or valving arrangements. The invention is of particular use in the electron beam welding of small workpieces, but is also applicable to the welding by electron beam of larger workpieces or any other operation requiring reduced pressure or vacuum, e.g. brazing, metallizing and evaporation, freeze drying, leak detection, sample charging in electron microscopy or impregnation.

BACKGROUND OF THE INVENTION

In previously proposed arrangements for operations of this type, the workpieces are often inserted either singly or in batches on an indexing mechanism in a vacuum chamber, by a door therein. This is both time consuming and expensive since when each workpiece or batch is finished, it must be removed and replaced by fresh work which requires either elaborate sealing devices or means for raising the pressure in the chamber to atmospheric pressure whilst the replacement procedure is performed and the reduction of the pressure in the chamber is then again ready for the performance of the operation on the fresh work therein.

To avoid this problem, it is necessary to transfer the workpieces through a sealed chamber on a continuous basis conveniently in a series of individual workpiece compartments which move along an input passage and into the sealed chamber in which the pressure is reduced, and then out of the chamber along an output passage, each compartment being sealable whilst in the input and output passages so that the pressure in the individual compartments can be independently varied as necessary, i.e. to reduce the pressure in a compartment before it reaches the sealed chamber and thereby avoid fluctuations in the reduced pressure in the sealed chamber. However, previous attempts to provide such a system tend to be inefficient, requiring either complex sealing arrangements or a compromise in the effectiveness of the seals of each compartment.

The object of the present invention is to provide an improved apparatus and method for transferring work on a continuous basis through a region of reduced pressure having efficient seals of simple construction.

SUMMARY OF THE INVENTION

According to the present invention there is provided apparatus for transferring workpieces through a region of reduced pressure for the performance of an operation thereon, said apparatus comprising a sealed chamber; first pressure reducing means for reducing the pressure within the sealed chamber below atmospheric pressure; means defining a passageway extending through the sealed chamber; a plurality of workholders each shaped for insertion into an input end of said passageway for movement therealong, each end of each workholder including an annular portion disposed for sealing engagement of the wall of the passageway when the workholder is located therein, so that when the workholders are disposed end to end in said passageway they define a series of compartments within the passageway which move therealong as the workholders are moved along the passageway, the workholders including means for supporting a workpiece within each compartment, there being an opening in the part of the passageway which is located within the sealed chamber whereby the interior of a compartment as it reaches an operating station in the passageway adjacent said opening is exposed to the interior of the sealed chamber for the performance of an operation on a workpiece supported in said compartment; means located adjacent said input end of the passageway for pushing the workholders along the passageway; second pressure reducing means for reducing the pressure in each compartment in turn to a level between atmospheric pressure and the reduced pressure in the sealed chamber as the workholders are moved along the passageway towards said operating station, said second pressure reducing means being in communication with the interior of said passageway via a port in the wall of said passageway located upstream of said sealed chamber with regard to the direction of movement of the workholders along said passageway, the dimension along the passageway of said port being greater than the dimension along the passageway between the forward edge, with regard to the direction of movement of the workholders along said passageway, of said annular portion of the rearward end of one workholder and the rearward edge of the said annular portion of the adjacent forward end of the workholder which immediately succeeds said one workholder in the passageway so that whilst one compartment downstream of said port is disposed at said operating station adjacent said opening for the performance of an operation on a workpiece supported therein the rearward annular end portion of a workholder upstream of said operating station and the adjacent forward annular end portion of the immediately succeeding workholder are both disposed adjacent the port between the sides of said port.

The means for supporting a workpiece in each compartment may comprise means provided at the end surface of each workholder for supporting a respective part of a workpiece so that said respective workpiece part extends outwardly of that end of the workholder whereby when said workholders are disposed in said passageway end to end and are spaced apart therealong, the space between each pair of adjacent workholder ends constitutes a respective one of said compartments, said means for pushing the workholders along the passageway being arranged so that when the apparatus is in use with a respective workpiece in each of said compartments, the parts of each respective workpiece are pushed together in the longitudinal direction of the passageway and the pushing force is transmitted from one workholder to the next workholder immediately downstream thereof via the workpiece in the compartment between the adjacent ends of said two workholders.

Alternatively, the workholders may be arranged to be disposed end to end in said passageway with their adjacent ends in abutting relationship, each of said compartments being defined between the ends of a respective one of said workholders.

Preferably each annular workholder end portion comprises a pliable sealing member, which may be an 'O' ring or sealing ring of rectangular cross section, made for example of neoprene embedded in the periphery of the respective workholder end. Alternatively, it is possible that the passageway wall which is engaged by said sealing member may be adapted to constitute a stationary annular portion of each workholder and as the workholders pass along the passageway to provide the necessary sealing action between adjacent compartments.

The apparatus according to the present invention is particularly suitable, but not exclusively, for use in the electron beam welding of workpieces.

DETAILED DESCRIPTION OF PREFERRED EMBODIMENTS

Figure 1:
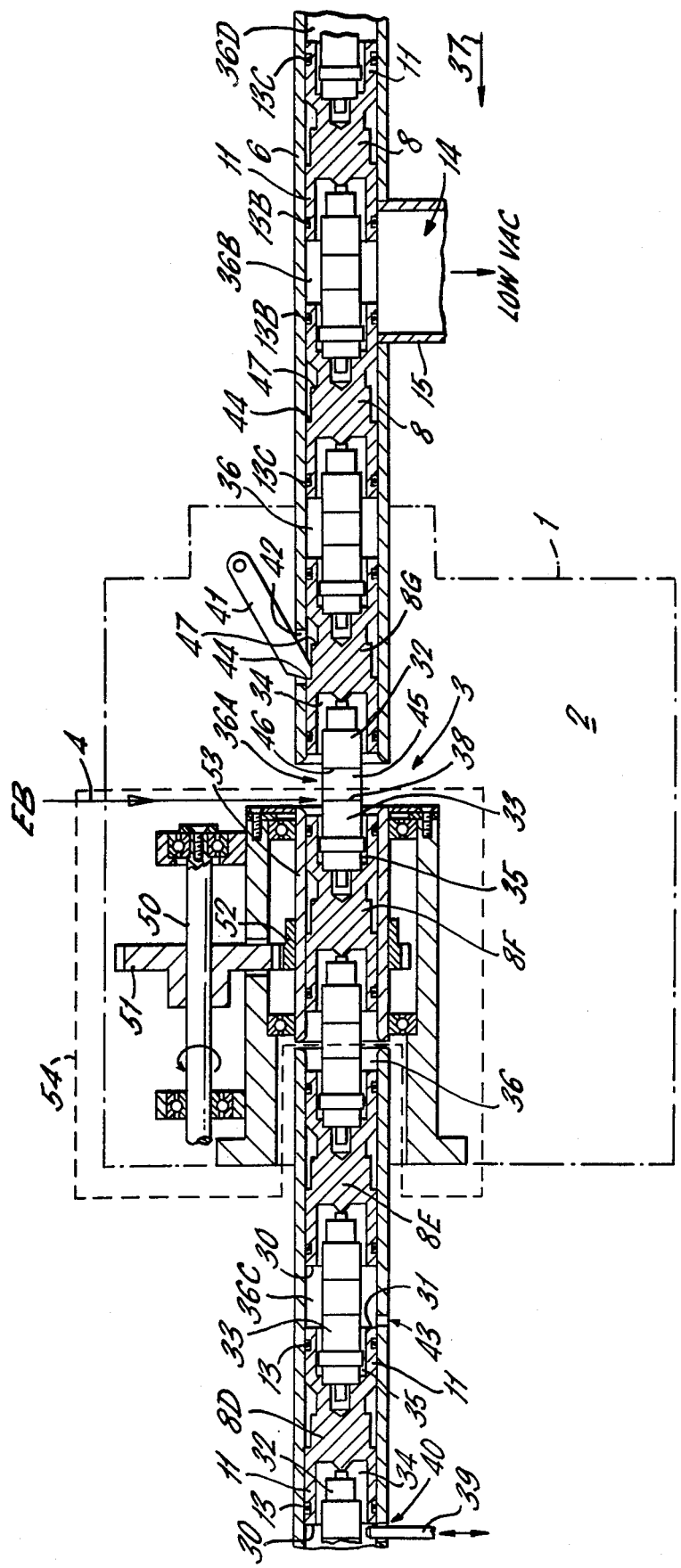
FIG. 1 illustrates schematically a side sectional view of an embodiment of apparatus according to the present invention, adapted for electron beam welding.

Referring to FIG. 1, the apparatus illustrated therein comprises a sealed housing 1 which defines a sealed chamber 2, the walls of the housing 1 being capable of withstanding reduced pressures in the chamber 2, so that a vacuum of, for example, at least $10^{-2}$ Torr can be produced in the chamber 2 by suitable conventional pressure reducing means not specifically illustrated. An electron gun (not shown), of suitable design is provided so that it can direct a beam 4 of electrons at an operating station 3 within the sealed chamber. An open ended tube 6 pierces the walls of the housing 1 so as to provide a passageway extending through the chamber 2, there being suitable seals (not shown) between the outside of the tube and the walls of the housing. The tube 6 is interrupted at the operating station 3 to provide an opening for the passage of the beam of electrons across the passageway. A plurality of workholders 8 are provided, being shaped so that they can be placed inside the tube 6 and moved therealong in a manner to be described below. At each end 11 of each workholder 8 there is provided an annular portion 13 which is adapted for sealing engagement with the inside surface of the tube when the workholder is placed therein, this annular portion being preferably an annular sealing member, such as an 'O' ring or a sealing ring of rectangular cross-section, made of neoprene or some other suitable pliable material. Because it is only necessary for there to be sealing engagement of each end of the workholder with the walls of the passageway as the workholder is moved therealong, any other means for providing this sealing engagement may be used in place of the annular sealing members 13.

Each end surface 30, 31 of each workholder is provided with means for supporting a respective part 32, 33 of a multipart workpiece, these supporting means preferably comprising a recess 34, 35 in the respective end surfaces 30, 31. The length of each of the recesses 34, 35 relative to the length of the respective workpiece parts 32, 33 which they are adapted to accommodate is such that the respective workpiece part when located in the recess extends outwardly of the respective end surface 30, 31 as illustrated. Thus, when a plurality of workholders are inserted into the tube 6 at an input end thereof so that the workholders are end to end along the tube, with the facing end surfaces 30, 31 of adjacent workholders spaced apart along the tube, each space between adjacent workholders defines a compartment 36 in which a multi-part workpiece can be accommodated with one part 33 thereof located in the respective recess 35 and another part 32 thereof accommodated in the respective recess 34 in the workholder end surfaces 31, 30 respectively which define that compartment.

Once the workholders have been so disposed in the tube, and a multi-part workpiece has been loaded into each compartment thus defined in the tube, subsequent pushing of the series of workholders along the tube away from the input end in the direction of arrow 37 by, for example, a slider, pushes the parts of the workpiece together to form butt joints which are to be welded by the electron beam once the respective workpiece in its compartment arrives at the operating station 3. Because the only way that the pushing force can be transmitted from one workholder to another along the passageway is via the respective workpiece located in the compartment defined in the space between these two workholders, the workpiece parts are pushed tightly together at said butt joints and the workpiece parts 32 and 33 are pushed tightly against the end walls of the respective recesses 34, 35. This firm holding of each workpiece within its compartment is assisted by the equilibrium in the atmospheric pressure exerted on the outward ends of the endmost workholders in said series of workholders, because the tube 6 is open ended, which results in a pressure differential between both ends of the tube and the part of the passageway at the operating station because the pressure in the sealed chamber is reduced below atmospheric pressure. In other words, whether a workholder is upstream or downstream of the operating station, with regard to the direction of arrow 37, it is always urged by this pressure differential towards the operating station. The existence of the pressure differential makes it possible to move the workholders along the passageway effectively without any physical interconnection between them other than the abutting parts of the workpieces in the compartments 36 between adjacent workholders.

The workholders may be moved continuously along the tube, for the performance of welds on the workpieces having an appreciable dimension parallel to the longitudinal axis of the tube, or alternatively, the workholders may be indexed in stepwise fashion between the positions illustrated, the workholders halting in each of the illustrated positions for the performance of a welding operation at the operating station before the next stepwise movement. It will be apparent that as each compartment 36 arrives at the operating station 3, its interior is exposed to the interior of the sealed chamber and the pressure inside that compartment is reduced to the low pressure already existing in the sealed chamber. It is clearly desirable to reduce the pressure in a compartment arriving at the operating station to the pressure in the sealed chamber as quickly as possible, and accordingly, some form of preliminary reduction of pressure in the compartment interior is needed before that compartment reaches the operating station. To perform this, a port 14 is provided at a location upstream of the operating station 3, the port 14 being connected via a conduit 15 to suitable pressure reducing means, such as a pump. Where the pressure in the sealed chamber is reduced to at least $10^{-2}$ Torr, the pump connected to port 14 is preferably capable of reducing the pressure in a compartment adjacent port 14 to at least 0.1 Torr.

It will be evident from FIG. 1 that the dimension along the passageway of the port is greater than the distance along the passageway between the front edge (with regard to arrow 37) of the sealing member 13 at the rear end of one workholder and the rear edge of the sealing member 13 at the front end of the workholder immediately succeeding the first-mentioned workholder in the passageway, but is less than the distance between the sealing members 13 at each end of any one of the workholders. Thus when the workholders are indexed to the positions illustrated, one compartment 36A is brought to the operating station 3 so that a weld can be performed on a butt joint 38 on the workpiece located in compartment 36A, and simultaneously both of the seals 13B disposed at the ends of a compartment 36B which is upstream of the operating station are located in the passageway adjacent the port 14 between the sides of the port 14, so that the preliminary evacuation of compartment 36B can occur. Because the seals 13B are both between the sides of the port 14, it will be apparent that some evacuation of the passageway upstream and downstream of the compartment 36B also occurs, the volume of the passageway affected being bounded by sealing members 13C located respectively immediately upstream and immediately downstream of the sealing members 13B. This arrangement prevents the occurrence of unwanted rises in pressure in the compartment 36B when it leaves its location adjacent the port 14 and is indexed down the passageway towards the operating station. This situation is possible in the embodiment of the apparatus illustrated because the particular pliable sealing members used constitute effective leak-tight seals between the ends of the workholders and the walls of the passageway.

When the apparatus is adapted to index the workholders in stepwise fashion along the tube, so that each compartment is halted at the operating station in the position shown as occupied by compartment 36A at the end of a stepwise movement, it is preferable that some means be provided for establishing an accurate datum for the proper location of a workpiece joint to be welded with respect to the point at which the beam of electrons contacts the workpiece. In this embodiment, once the workholders are halted in the positions shown, a plunger 39 is moved through a respective hole 40 in the tube wall downstream of the operating station, so that the plunger engages the front end surface 30 of the workholder 8D to prevent its forward movement. Simultaneously, a pawl 41, preferably disposed within the sealed chamber 2 is rotated so that it protrudes through a corresponding hole 42 into the passageway to constitute said datum. The workholders are moved to position the compartment 36A and thus the workpiece within it correctly with respect to this datum by means of a blast of compressed air supplied by suitable means to a hole 43 in the tube wall located between the hole 40 and the operating station, at a position which is between the facing end surfaces 30 and 31 of adjacent workholders 8D and 8E (i.e. adjacent compartment 36C) when the workholders halt in the positions illustrated. Because the workholder 8D cannot move forward due to its engagement with the plunger 39, the workholders 8D, 8F and 8G are compelled by the compressed air blast to move rearwardly until a rearwardly facing abutment shoulder 44 on workholder 8G engages the pawl 41. At this point, the joint 38 in the workpiece in compartment 36A defined between workholders 8F and 8G is correctly aligned with the beam 4 of electrons, so that when the beam is switched on welding of joint 38 can occur.

Although the apparatus described is clearly suitable for use in welding two-part workpieces having one butt joint which requires welding, because the workpiece joints are clamped as described above by the indexing means and also by the pressure differential existing along the passageway, it is possible for the apparatus to be used in the joining of workpieces having more than one butt joint requiring welding, additional workpiece parts, such as the part 45 being interposed between the parts 32 and 33 located in the respective recesses in the workholders, to form the joint 38 between parts 33 and 45 and a second joint 46 between parts 45 and 32. In order that both joints 38 and 46 on each workpiece can be successively welded, the indexing means is adapted so that at the end of a first stepwise movement, the workholders take up the positions illustrated, with joint 38 aligned with the electron beam 4 to be welded when the beam is switched on, and the next stepwise movement serves to move the workholders along the passageway through a distance equal to the spacing between joints 38 and 46, until at the end of this second stepwise movement joint 46 is aligned with the electron beam and welding thereof can occur when the beam is switched on.

In order to allow for the establishment of a datum for the welding of joint 46, each workholder is provided with a second rearward facing abutment shoulder 47, spaced from the abutment shoulder 44 on that workholder by a distance equal to the spacing of joints 38 and 46. A second plunger (not shown) similar in construction and operation to plunger 39 but spaced downstream thereof by a distance equal to the spacing of joints 38 and 46 is moved into the passageway through a respective hole (not shown) to prevent forward movement of workholder 8D. The air blast is again supplied via hole 43 to move the workholders rearwardly until the shoulder 47 on workholder 8G engages the pawl 41 and welding of joint 46 can occur.

Once all the joints on one workpiece have been welded, the next stepwise movement is made long enough to bring the first joint of the immediately succeeding workpiece into alignment with the electron beam at the operating station. In other words, the stepwise movements are not all of the same length, but follow a cyclic pattern determined by the spacing of the various joints on the workpiece and the distance between compartments.

In order to permit free passage of the workholders along the tube during each stepwise movement, the plunger 39 or the second plunger respectively, and the pawl 41 are retracted from the passageway after the welding of the respective joint has been completed, and before the next stepwise movement begins.

It is preferable that the port 14 is wide enough so that at the end of the second stepwise movement, the sealing members 13B are still located adjacent the port 14 between the sides of the port 14 to permit continued evacuation of the passageway between respective sealing members 13B and 13C upstream and downstream of compartment 36B.

It will be apparent that if additional preliminary pressure reduction is required in the compartments before they reach the sealed chamber 2 then a second port 14 and attendant evacuation pump may be provided upstream of the illustrated port 14. Additionally, or alternatively, the pressure in compartment 36C between workholders in positions 8D and 8E downstream of the sealed chamber 2 can be raised and a compartment 36D upstream of the port 14 correspondingly reduced by the provision of a conduit cross-connecting these compartments (i.e. opening into the passageway at the locations corresponding to the compartments 36C and 36D as illustrated). In this latter case, the hole 54 through which the compressed air is supplied for the establishment of the data and the plunger 39 (and the second plunger if provided) are located at least one workholder length further downstream than the positions illustrated.

In order that a joint such as joint 38 in a workpiece at the operating station can be welded from all sides, it is desirable to rotate the workpiece during the welding operation. At the same time, the structure of the housing becomes more complex and potentially less vacuum tight if a shaft for rotating the workpiece has to penetrate the wall of the housing, necessitating some form of sealing means between the rotating shaft and the stationary housing wall. Accordingly, it is important to provide a reliable, non-wearing leak-tight means for transmitting rotational torque through the housing wall. Preferably, in the embodiment of the invention illustrated, torque is transmitted to a driven shaft 50 located within the sealed chamber 2 from drive means (not shown) located outside the sealed chamber, via a suitably constructed ferro fluidic device (not specifically illustrated) provided in the housing wall.

The driven shaft 50 carries a gear 51 which meshes with a second gear 52 mounted on a section 53 of the tube wall which is separated from the remainder of the tube. Thus rotation of the driven shaft 50 is transmitted via the gears 51, 52 of the tube section 53, so that the tube section 53 rotates about the longitudinal axis of the tube. The tube section 53 is of such a length and is located within the sealed chamber at such a position that when the workholders are indexed to the positions illustrated, the workholder 8F is located completely within the tube section 53 for rotation therewith about said longitudinal axis when the driven shaft 50 rotates. The recess 34 in the right-hand end of the workholder 8F (as viewed in the drawing) is shaped so that it grips the part 33 of the workpiece in compartment 36A, so that the workpiece also is rotated about the longitudinal axis of the tube. The recess 35 on the left hand end of the workholder 8G on the other hand is shaped so that it engages the workpiece part 32 with a point contact only, so that the part 32 of the workpiece in compartment 36A can be rotated relative to the workholder 8G.

In order to enlarge the opening in the tube at the operating station, perhaps in order to perform several welds on one workpiece, or alternatively to perform a long single weld on the workpiece, the tube section 53 and the means for rotating it are preferably removable from the sealed chamber in one piece, represented in the drawing by the dotted line 54.

Figure 2:
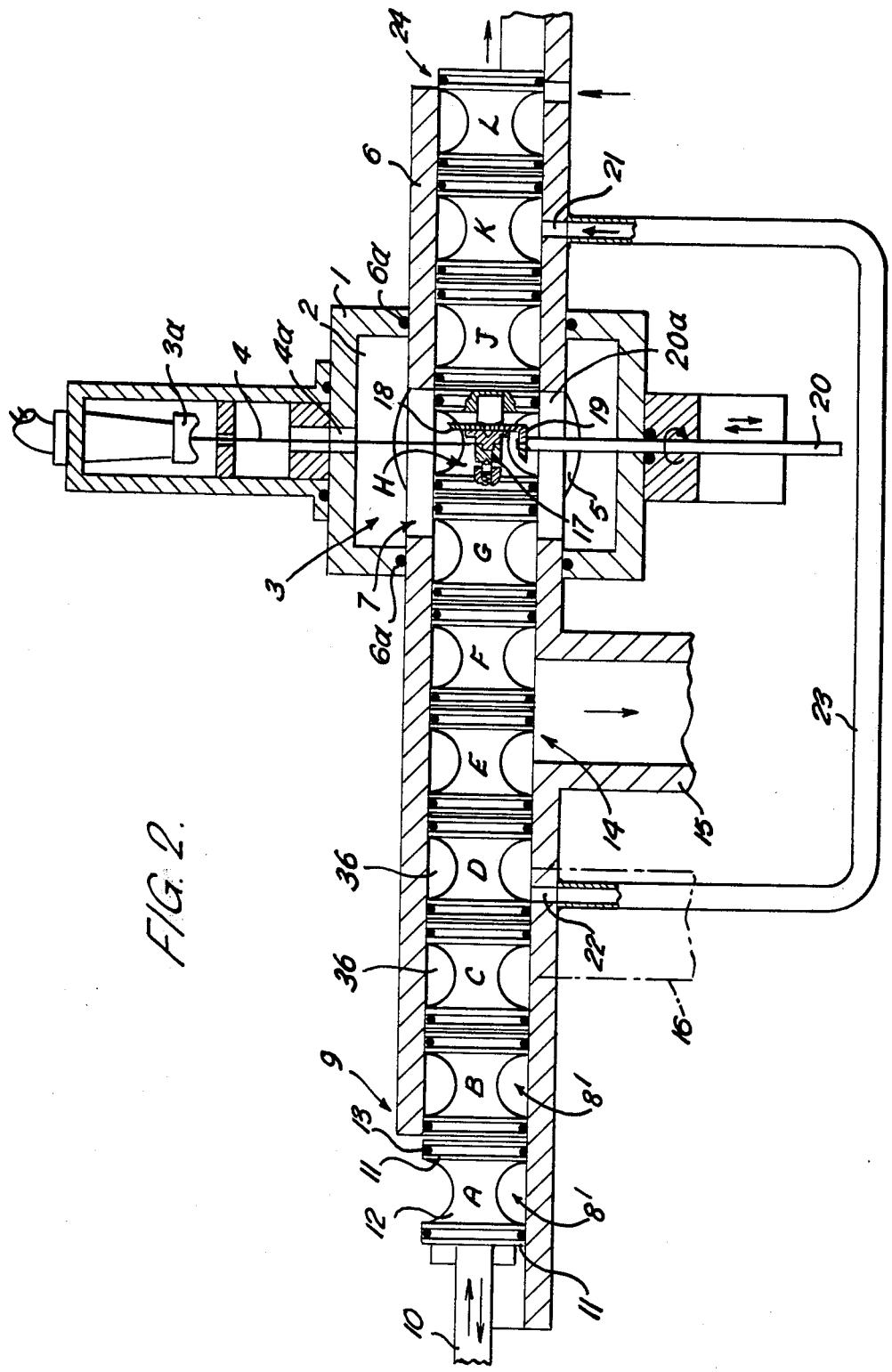
FIG. 2 illustrates a similar view to that of FIG. 1 of a second embodiment of apparatus according to the present invention, also adapted for electron beam welding.

Referring to the second embodiment of the invention shown in FIG. 2, it should first be noted that features common to both FIGS. 1 and 2 are identified by like reference numerals.

In the embodiment of FIG. 2, there is shown the 'O' ring seals 6a between the housing and the tube 6, and the electron gun 3a of suitable design which provides the beam 4 of electrons into the chamber 2 via an aperture 4a in the housing 1 and into the tube 6 via an aperture 7 therein. The housing 1 is also provided with a port 5 to which is connected a suitable vacuum pump (not shown) for evacuating the chamber 2.

The principal difference between this embodiment and that of FIG. 1 is the construction of the workholders, identified as 8' in FIG. 2, and the manner in which they define the compartments 36 as they move along the tube 6 from the input end 9 thereof under the influence of a reciprocating slider 10. Each workholder 8' is substantially cylindrical, having disc-like end walls 11 in which are embedded the sealing rings 13, and an intermediate portion 12 which connects the end walls 11. The workholders 8' are inserted into the tube 6 end to end in abutting relationship one with another, i.e. there is no space between successive workholders as they are pushed along the tube 6. Thus in this embodiment, each of the compartments is formed in a respective one of the workholders, being constituted by the space defined by the respective intermediate portion 12 of that workholder, a workpiece being supported in each compartment in a suitable manner as indicated for the workholder in position H (i.e. at the operating station 3).

As before, the workholders are pushed along the tube, either smoothly or in stepwise fashion, through successive positions A through 9 and thence to the operating station 3 at position H and then through downstream positions J to L to the output end 24 of the tube 6. The workholders at positions A and L are thus subjected to atmospheric pressure acting in opposite directions, serving to hold the workholders together along the tube. The preliminary evacuation port 14 is located at positions E and F, so that two compartments can be preliminarily evacuated simultaneously. Additional or alternative preliminary reduction in the pressure in each compartment may be provided by means of a conduit 23 which connects ports 22 and 21 in the tube wall at locations corresponding to positions D and K respectively. Clearly, a compartment at position D (upstream of port 14) will contain air at atmospheric pressure whilst a compartment at position K which is downstream of the operating station 3 will contain air at the reduced pressure of at least $10^{-2}$ Torr produced in the sealed chamber 2, so that this cross-section equalises the pressure in these two compartments to a level intermediate atmospheric pressure and the reduced pressure of at least $10^{-2}$ Torr by effectively doubling the volume to be occupied by the air in the compartments.

I claim:

1. An apparatus for transferring workpieces through a region of reduced pressure for the performance of an operation thereon, said apparatus comprising
    a sealed chamber;
    first pressure reducing means for reducing the pressure within the sealed chamber below atmospheric pressure;
    means defining a passageway extending through the sealed chamber and having an input end;
    a plurality of workholders each shaped for insertion into the input end of said passageway for movement therealong, each end of each workholder including an annular portion disposed for sealing engagement with the wall of the passageway when the workholder is located therein, so that when the workholders are disposed end to end in said passageway they define a series of compartments within the passageway which move therealong as the workholders are moved along the passageway, the workholders including means for supporting a workpiece within each compartment;

means in the part of the passageway located within the sealed chamber defining an opening for permitting the interior of a compartment, as it reaches an operating station in the passageway adjacent said opening, to be exposed to the interior of the sealed chamber for the performance of an operation on a workpiece supported in said compartment;

means located adjacent said input end of the passageway for pushing the workholders along the passageway;

second pressure reducing means for reducing the pressure in each compartment in turn to a level between atmospheric pressure and the reduced pressure in the sealed chamber as the workholders are moved along the passageway towards said operating station, said second pressure reducing means including a port in communication with the interior of said passageway through the wall of said passageway, said port being located upstream of said sealed chamber with regard to the direction of movement of the workholders along said passageway, the dimension along the passageway of said port being greater than the dimension along the passageway between the forward edge, with regard to the direction of movement of the workholders along said passageway, of said annular portion of the rearward end of one workholder and the rearward edge of the said annular portion of the adjacent forward end of the workholder which immediately succeeds said one workholder in the passageway and the spacing of said port from said operating station being such that, while one compartment downstream of said port is disposed at said operating station adjacent said opening for the performance of an operation on a workpiece supported therein, the rearward annular end portion of a workholder upstream of said operating station and the adjacent forward annular end portion of the immediately succeeding workholder are both disposed adjacent the port between the upstream and downstream limits of said port.

2. Apparatus as claimed in claim 1, in which said means for supporting a workpiece within each compartment comprises means provided at the end surface of each workholder for supporting a respective part of a workpiece so that said respective workpiece part extends outwardly of that end of the workholder whereby when said workholders are disposed in said passageway end to end and are spaced apart therealong, the space between each pair of adjacent workholder ends constitutes a respective one of said compartments, said means for pushing the workholders along the passageway being arranged so that when the apparatus is in use with a respective workpiece in each of said compartments, the parts of each respective workpiece are pushed together in the longitudinal direction of the passageway and the pushing force is transmitted from one workholder to the next workholder immediately downstream thereof via the workpiece in the compartment between the adjacent ends of said two workholders.

3. Apparatus as claimed in claim 2, in which the end surface of each workholder is recessed to accommodate said respective workpiece part.

4. Apparatus as claimed in claim 3 in which the recess in one end surface of each workholder is shaped to support only the end surface of said respective workpiece part so that the workpiece part can be rotated about the longitudinal axis of the passageway with respect to said workholder, the recess at the other end of the workholder being shaped to engage the respective workpiece part for rotation therewith about said longitudinal axis, there being provided means within said sealed chamber for joining the parts of each workpiece where the workpiece is multi-part when the compartment containing said workpiece reaches the operating station, and means at the operating station for rotating, about said longitudinal axis, each workholder in turn conjointly with the workpiece in the compartment adjacent said other end of the workholder whilst the joining means operates to join said workpiece parts so that all sides of the joint between the workpiece parts can be joined.

5. Apparatus as claimed in claim 4, in which said rotating means includes a driven shaft located within the sealed chamber, means for transmitting rotation of said driven shaft to said workpiece during joining of its parts, driving means located outside said sealed chamber and means for transmitting torque from said driving means through the wall of said sealed chamber to said driven shaft whilst preserving the reduced pressure in said sealed chamber.

6. Apparatus as claimed in claim 1, in which said workholders are arranged to be disposed end to end in said passageway with their adjacent ends in abutting relationship, each of said compartments being defined between the ends of a respective one of said workholders.

7. Apparatus as claimed in claim 1, further including means for rotating a workpiece supported within a compartment about the longitudinal axis of the passageway when that compartment reaches said operating station, said rotating means including a drive shaft located within the sealed chamber, means for transmitting rotation of said drive shaft to said workpiece, driving means located outside said sealed chamber, and means for transmitting torque from said driving means through the wall of said sealed chamber to said drive shaft whilst preserving the reduced pressure in said sealed chamber.

8. Apparatus as claimed in claim 7, in which said torque transmitting device comprises a ferro fluidic device.

9. Apparatus as claimed in claim 1, in which said workholder pushing means comprises means for indexing the workholders along said passageway in stepwise fashion so that at the end of each stepwise movement the rearward annular end portion of each workholder in turn and the adjacent forward annular end portion of the immediately succeeding workholder are halted adjacent said port between the sides of said port, and a respective compartment downstream of said port is halted at said operating station adjacent said opening for the performance of an operation on a workpiece supported therein.

10. Apparatus as claimed in claim 9, and further including means for correcting the position of a compartment at said operating station and hence a workpiece located therein, said position correcting means including means for defining a datum position and means for urging said compartment to a predetermined position relative to said datum.

11. Apparatus as claimed in claim 2, in which said workholder pushing means comprises means for indexing workholders along said passageway in stepwise fashion so that at the end of each stepwise movement the rearward annular end portion of each workholder in turn and the adjacent forward annular end portion of the immediately succeeding workholder are halted adjacent said port between the sides of said port, and a respective compartment downstream of said port is halted at said operating station adjacent said opening for the performance of an operation on a workpiece supported therein, and means for correcting the position of a compartment at said operating station, and hence a workpiece located therein, said compartment position correcting means comprising means for supplying a compressed air blast, when the workholders are halted between two successive stepwise movements, to a hole in the passageway wall which is located between the adjacent annular end portions of two successive workholders downstream of said operating station after each stepwise movement, first abutment means movable into the passageway at the end of each stepwise movement to provide a forward abutment to prevent forward movement of the foremost of said two successive workholders under the action of said compressed air blast, and a second abutment means movable into said passageway after each stepwise movement to define a datum position by constituting a rearward abutment to limit the rearward movement of a workholder upstream of said operating station under the action of said compressed air blast, whereby once said first and second abutment means have been moved into the passageway after a stepwise movement and said compressed air blast has been supplied to said hole, all the workholders between said first and second abutment means move rearwardly until a rearward facing abutment shoulder of the respective workholder upstream of the operating station engages said second abutment means, said first and second abutment means being withdrawn from said passage before the succeeding stepwise movement commences.

12. Apparatus as claimed in claim 11, in which said first abutment means comprises a plunger which is movable through an aperture in the passageway wall to engage the forward end of the foremost of said two successive workholders.

13. Apparatus as claimed in claim 11 in which said second abutment means comprises a rotatable pawl which passes through a respective aperture in the passageway upstream of said operating station to engage said rearward facing abutment shoulder on the respective workholder.

14. Apparatus as claimed in claim 13, in which said aperture for said pawl is located in the port of the passageway wall which is inside the sealed chamber upstream of the opening at said operating station so that as each compartment passes said aperture, its interior is exposed to the interior of the sealed chamber to reduce the pressure in said compartment to that of said sealed chamber before the operating station is reached.

15. Apparatus as claimed in claim 2, in which said workholder pushing means comprises means for indexing the workholders along said passageway in stepwise fashion, the length of the opening in the passageway at the operating station relative to the length of each stepwise movement being such that when each compartment arrives at the operating station and its interior is exposed to the interior of said sealed chamber at the end of one stepwise movement, its interior is still exposed to the interior of the sealed chamber at the end of the next stepwise movement in order that two operations can be performed on a workpiece in said compartment at respective locations thereon spaced by the length of one stepwise movement, and upstream of said operating station at the end of said one stepwise movement the rearward end portion of a respective workholder and the adjacent forward end portion of the immediately succeeding workholder are both disposed adjacent said port between the sides of said port for the reduction of pressure in the compartment between the adjacent ends of these two workholders by said second pressure reducing means.

16. Apparatus as claimed in claim 15, in which means are provided for correcting the position along the passageway of a compartment adjacent said opening at the operating station after the first stepwise movement when the compartment first reaches said operating station and after the next stepwise movement to define a datum for the performance of said two operations on a workpiece in said compartment.

17. Apparatus as claimed in claim 16, in which said compartment position correcting means comprises means for supplying a blast of compressed air, when the workholders are halted between said first and said next stepwise movements, to a hole in the passageway wall at a location between the adjacent annular end portions of two successive workholders downstream of said operating station after each of said stepwise movements, first abutment means movable into the passageway at the end of both said first and said next stepwise movements, to provide a forward abutment to prevent forward movement of the foremost of said two successive workholders under the action of said compressed air blast, and second abutment means movable into said passageway after both said first and said next stepwise movements to define said datum by constituting a rearward abutment to limit the rearward movement of a workholder upstream of said operating station under the action of said compressed air blast, whereby once said first and second abutment means have been moved into said passageway after said first stepwise movement, and said compressed air blast has been supplied to said hole, all the workholders between said first and second abutment means moves rearwardly until a first rearward facing abutment shoulder on the respective workholder engages the second abutment means, there being a second rearward facing abutment shoulder on said respective workholder which is engaged with said second abutment means in similar fashion after said next stepwise movement, both the first and second abutment means being withdrawn from said passageway before the succeeding stepwise movement commences.

18. Apparatus as claimed in claim 17, in which said first abutment means comprises a first plunger which is movable through a respective aperture in the passageway wall at the end of said first stepwise movement and a second plunger which is movable through another respective aperture spaced by the length of said second stepwise movement from the aperture of said first plunger at the end of said second stepwise movement to engage the forward end of the foremost of said two successive workholders.

19. Apparatus as claimed in claim 17, in which said second abutment means comprises a rotatable pawl which passes through a respective aperture in the passageway upstream of said operating station to engage the respective one of said two rearward facing abutment shoulders on the respective workholder.

20. Apparatus as claimed in claim 19, in which said aperture for said pawl is located in the part of the passageway wall which is inside the sealed chamber upstream of the opening at said operating station so that as each compartment passes said aperture, its interior is exposed to the interior of the sealed chamber to reduce the pressure in said compartment to that of said sealed chamber before the operating station is reached.

21. Apparatus as claimed in claim 1, in which the dimension along the passageway between the annular portions at the ends of each workholder is greater than the dimension along said passageway of said port.

22. Apparatus as claimed in claim 1, in which means are provided for enlarging said opening in the passageway at said operating station by removal of at least part of the passageway within said sealed chamber.

23. Apparatus as claimed in claim 1, in which a second opening is provided in the part of the passageway within the sealed chamber upstream of said first-mentioned opening so that the interior of each compartment can be exposed to the interior of said sealed chamber via said second opening before that compartment arrives at the first opening at said operating station.

24. Apparatus as claimed in claim 1, in which said annular portion at each end of each workholder comprises a pliable sealing member.

25. Apparatus as claimed in claim 24, in which said pliable sealing member is an 'O' ring or a sealing ring of rectangular cross-section embedded in the periphery of the respective workholder end.

26. Apparatus as claimed in claim 1, in which means are provided for raising the pressure in each compartment in turn to a level between the reduced pressure in the sealed chamber and atmospheric pressure as the compartment passes a location downstream of the operating station.

27. Apparatus as claimed in claim 26, in which said means for raising the pressure in each compartment in turn comprises a conduit of which one end opens out into the passageway at said location downstream of the opening and the other end opens out into the passageway at a location downstream of said port.

28. Apparatus as claimed in claim 1, adapted for electron beam welding, the apparatus further comprising means for directing a beam of electrons through said sealed chamber into each compartment in turn when said compartment is at said operating station adjacent said opening so as to perform a welding operation on a workpiece supported therein.

29. Apparatus as claimed in claim 28, in which the first pressure reducing means is arranged to reduce the pressure in said sealed chamber to at least $10^{-2}$ Torr and the second pressure reducing means is arranged to reduce the pressure in each compartment as it reaches the port to at least 0.1 Torr.

30. A method of transferring workpieces through a region of reduced pressure for performance of an operation thereon, the method comprising the steps of
providing a sealed chamber having an interior pressure below atmospheric pressure, an operating station in the chamber, and a passageway extending through the chamber;
inserting into an input end of the passageway a plurality of workholders with an annular end portion of each of the workholders disposed in sealing engagement with the wall of the passageway and with the workholders arranged in end-to-end relationship to define a series of compartments within the passageway which move therealong as the workholders are moved along the passageway with the workholders supporting a workpiece within each compartment;
pushing the workholders and thereby the workpieces along the passageway;
providing a port in the wall of the passageway upstream of the sealed chamber, the port being coupled to a pressure reducing device;
sequentially reducing the pressure in each compartment to a level between atmospheric pressure and the reduced pressure in the sealed chamber as the workholders are moved along the passageway toward the operating station past the port;
exposing the interior of each compartment, in turn, to the interior of the sealed chamber through an opening in that part of the passageway which is located within the sealed chamber for the performance of an operation on the workpiece supported in the compartment as it reaches the operating station;
the dimension of said port in the longitudinal direction of said passageway being greater than the dimension along the passageway between the forward edge of said annular portion at the rearward end of the workholder and the rearward edge of the said annular portion of the adjacent forward end of the next following workholder,
and the spacing of the port from the operating station being such that the exposing of the compartment downstream of said port at said operating station by said opening for the performance of an operation on a workpiece supported therein takes place at the same time as the rearward annular end portion of a workholder upstream of said operating station and the adjacent forward annular end portion of the immediately following workholder are both disposed adjacent the port between the upstream and downstream limits of said port.

31. A method as claimed in claim 30, in which the workholders are indexed along the passageway so as to halt each compartment in turn adjacent said opening at the operating station.

32. A method of electron beam welding according to claim 30, the method comprising a method of transferring workpieces through said sealed chamber and including the further step of directing a beam of electrons through said sealed chamber at each workpiece in turn as the compartment within which that workpiece is supported arrives at the operating station.

33. A method as claimed in claim 32, including the further steps of reducing the pressure in said sealed chamber to at least $10^{-2}$ Torr and reducing the pressure in each compartment via said port to at least 0.1 Torr.

* * * * *